US010492321B2

(12) United States Patent
Yi

(10) Patent No.: US 10,492,321 B2
(45) Date of Patent: Nov. 26, 2019

(54) SELF-ACTUATING LATCH FOR A RACK MOUNTED DRIVE CHASSIS

(71) Applicant: Western Digital Technologies, Inc., Irvine, CA (US)

(72) Inventor: George Youzhi Yi, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 67 days.

(21) Appl. No.: 15/428,952

(22) Filed: Feb. 9, 2017

(65) Prior Publication Data
US 2018/0228045 A1 Aug. 9, 2018

(51) Int. Cl.
*F16M 11/00* (2006.01)
*H05K 7/14* (2006.01)
*E05B 65/44* (2006.01)
*H05K 5/02* (2006.01)

(52) U.S. Cl.
CPC ........... *H05K 7/1401* (2013.01); *E05B 65/44* (2013.01); *H05K 5/0221* (2013.01); *H05K 7/1489* (2013.01)

(58) Field of Classification Search
CPC ....... G06F 1/181; G06F 1/187; G11B 33/123; G11B 33/127; G11B 33/02; H05K 7/1488; H05K 5/0221
USPC ......... 248/220.21, 221.11; 312/223.1, 223.2, 312/223.3; 211/26
See application file for complete search history.

(56) References Cited

U.S. PATENT DOCUMENTS

| 6,288,902 B1 | 9/2001 | Kim et al. | |
| 6,952,341 B2* | 10/2005 | Hidaka | G11B 33/022 312/332.1 |
| 6,957,878 B2* | 10/2005 | Greenwald | A47B 88/43 312/223.1 |
| 7,318,532 B1 | 1/2008 | Lee et al. | |
| 7,477,525 B2* | 1/2009 | Coutancier | H05K 7/1489 361/724 |
| 8,416,563 B2* | 4/2013 | Hou | H05K 7/1489 211/26 |
| 8,641,313 B1* | 2/2014 | Crippen | H05K 5/0221 361/679.39 |

(Continued)

FOREIGN PATENT DOCUMENTS

| CN | 103517595 | 1/2014 |
| CN | 104204387 | 12/2014 |
| CN | 104411211 | 3/2015 |

OTHER PUBLICATIONS

International Search Report and Written Opinion dated Feb. 16, 2018 in International Patent Application No. PCT/US2017/063625.
English language Abstract for CN103517595 published Jan. 15, 2014.

(Continued)

*Primary Examiner* — Steven M Marsh
(74) *Attorney, Agent, or Firm* — Vierra Magen Marcus LLP

(57) ABSTRACT

A locking assembly is disclosed enabling quick and easy locking and removal of a drive chassis to and from a rack enclosure. A chassis may be removably secured within a rack enclosure using a pair of locking assemblies, one each at the left and right sides of a chassis. Each locking assembly comprises a latch assembly affixed to the drive chassis, and a catch mounted on a rack at the front edge of a rack enclosure. The latch assembly includes a self-actuated handle which is automatically opened and closed upon insertion of a chassis into the rack enclosure.

24 Claims, 10 Drawing Sheets

(56) References Cited

U.S. PATENT DOCUMENTS

| | | | |
|---|---|---|---|
| 9,442,538 B1* | 9/2016 | Chen | E05B 65/006 |
| 9,497,879 B2* | 11/2016 | Chen | F16B 2/18 |
| 10,098,459 B2* | 10/2018 | Chen | E05B 65/46 |
| 2007/0258224 A1 | 11/2007 | Fang | |
| 2008/0230496 A1* | 9/2008 | Henderson | H05K 7/1489 |
| | | | 211/26 |
| 2009/0294393 A1 | 12/2009 | Chen et al. | |
| 2010/0265679 A1 | 10/2010 | Van der mee et al. | |
| 2011/0279973 A1 | 11/2011 | Terwilliger et al. | |
| 2012/0307460 A1 | 12/2012 | Simon | |
| 2015/0156912 A1 | 6/2015 | Liang et al. | |
| 2016/0150659 A1 | 5/2016 | Chen et al. | |

OTHER PUBLICATIONS

English language Abstract for CN104204387 published Dec. 10, 2014.

English language Abstract for CN104411211 published Mar. 11, 2015.

\* cited by examiner

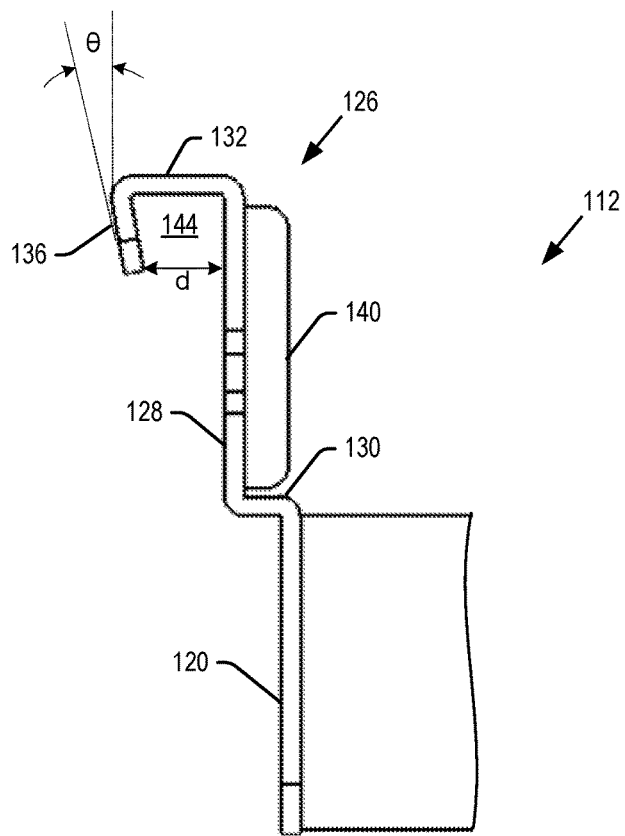
Fig. 5
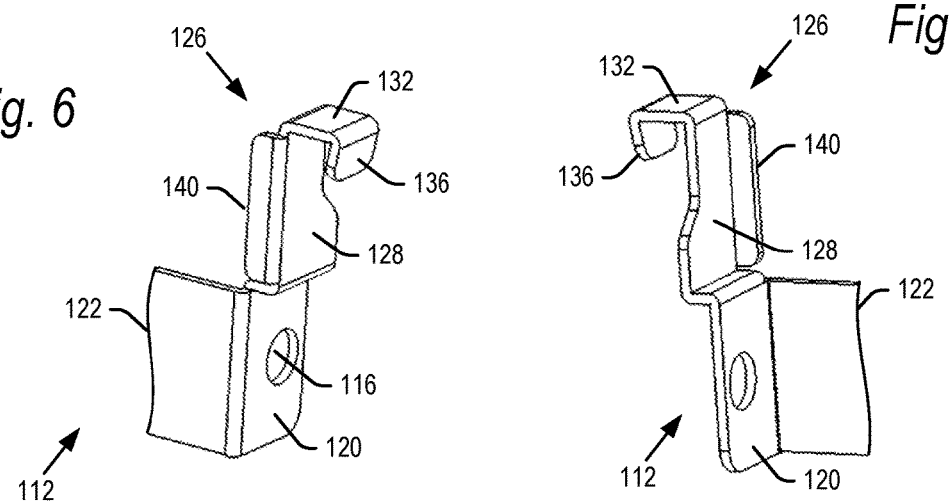
Fig. 6
Fig. 7

Fig. 9
Fig. 10
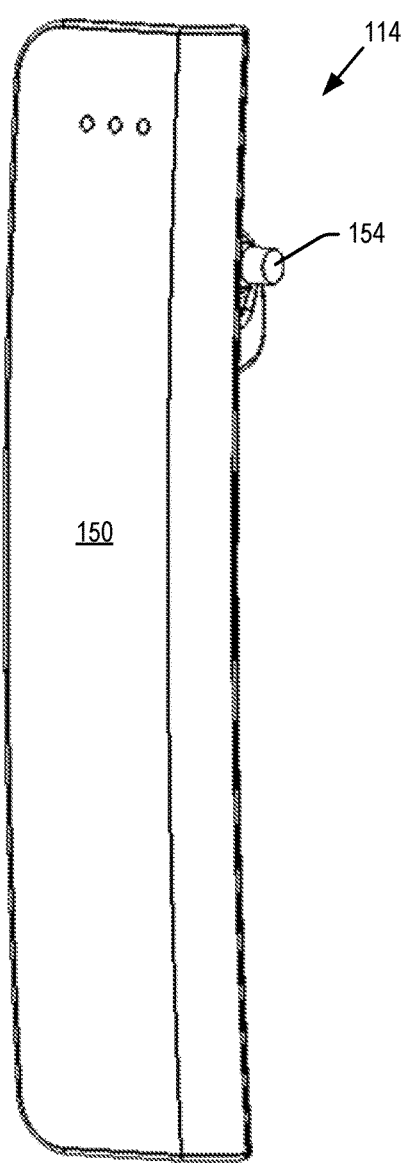
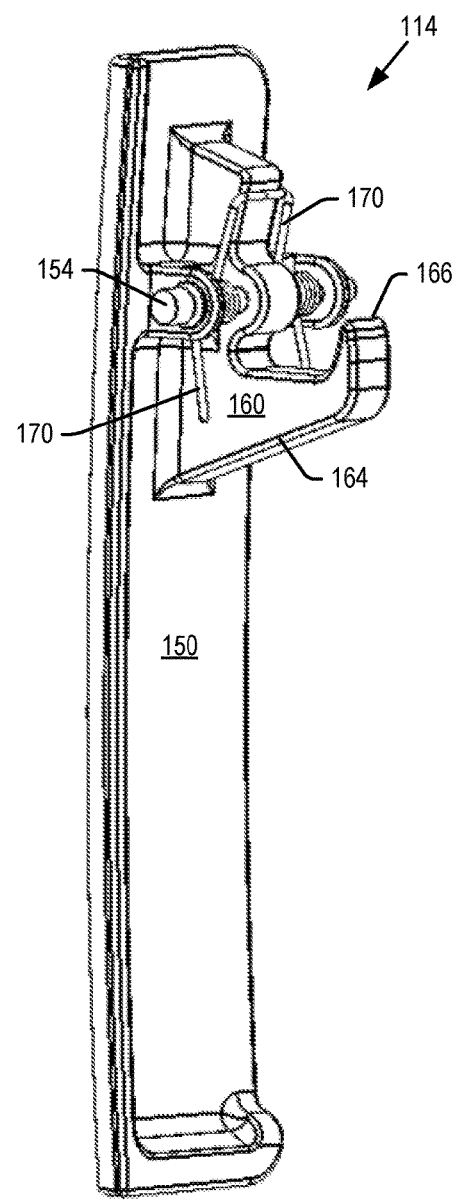

SELF-ACTUATING LATCH FOR A RACK MOUNTED DRIVE CHASSIS

BACKGROUND

Network attached storage (NAS) devices are employed by enterprises for various storage needs. Such storage devices are each typically housed within chassis which are then mounted within a rack enclosure including a pair of racks along the front edges. Conventional locking mechanisms, such as screws, lock the chassis within the rack enclosure during normal operation, but then can be removed so that chassis may be removed, swapped out, etc.

Conventional locking mechanisms for affixing drive chassis within a rack enclosure are cumbersome and inconvenient, often requiring a screwdriver or other tool to lock/unlock the drive chassis from the rack enclosure. Once such locking mechanisms are unlocked, it is also frequently difficult to grasp and remove the drive chassis from the rack enclosure.

DESCRIPTION OF THE DRAWINGS

FIGS. 4-7 are various perspective and side views of a catch according to embodiments of the present technology.

FIGS. 9-12 are various perspective and side views of portions of the latch assembly according to embodiments of the present technology.

DETAILED DESCRIPTION

The present technology will now be described with reference to the figures, which in embodiments, relate to a locking assembly enabling quick and easy locking and removal of a drive chassis to and from a rack enclosure. A chassis may be removably secured within a rack enclosure using a pair of locking assemblies, one each at the left and right sides of a chassis. Each locking assembly comprises a latch assembly affixed to the drive chassis, and a catch mounted on a rail at the front edge of a rack enclosure.

The latch assembly includes a latch fixedly mounted to a handle. As a drive chassis is inserted into the rack enclosure, a front hook portion of the latch abuts against an inclined prong formed on the catch. The latch and handle are rotatably mounted within the latch assembly so that, upon abutting the inclined prong of the catch, the latch rotates until the front hook portion of the latch clears the inclined prong of the catch. At that point, forces on the handle from a torsion spring and gravity drive the hook portion into the catch to lock the locking assembly and secure the drive chassis within the rack. In order to remove a chassis from the rack, the handles on opposed side of the chassis may be manually rotated outward to free the hook portion from the catch. Thereafter, the chassis may be removed by the handles.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top"/"bottom," "upper"/"lower," "vertical"/"horizontal," and "clockwise"/"counterclockwise" and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figure 1:
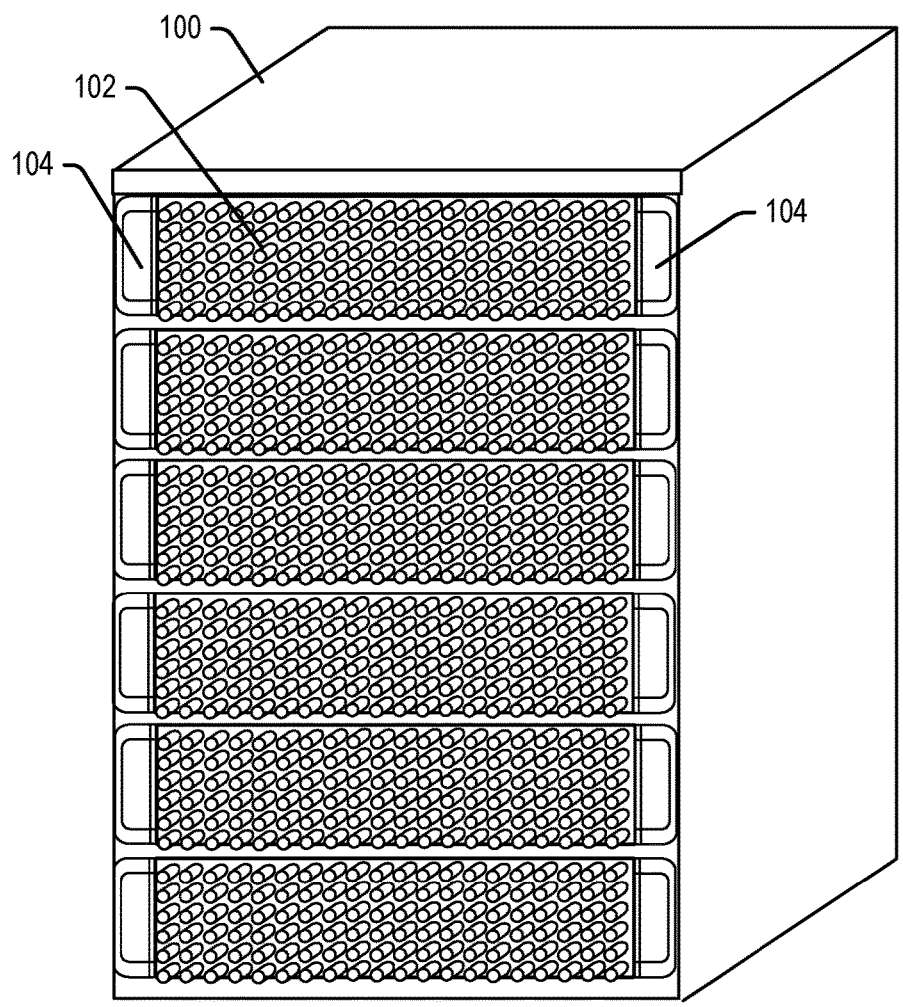
FIG. 1 is a perspective view of a rack enclosure including drive chassis.

Embodiments of the present technology will now be explained with reference to FIGS. 1-17. FIG. 1 is a perspective view of a drive rack enclosure 100 housing a number of drive chassis 102. Each chassis 102 may support a drive against a backplane (not shown) of the rack enclosure 100 to enable read/write operations with respect the drives within the rack enclosure 100. In one example, the drives may be solid state drives (SSDs) such as an InfiniFlash™ storage platform by SanDisk Corporation, Milpitas, Calif. However, the locking assembly of the present technology may be used to lock chassis holding a wide variety of other devices, including other SSDs, hard disc drives (HDDs), optical drives and other rack-mounted devices. The illustrated embodiment includes six chassis 102, but this is by way of example only and there may be more or less chassis in rack enclosure 100 in further embodiments. In embodiments, the rack enclosure may be a standard rack, for example 42U (rack units) tall.

Figure 2:
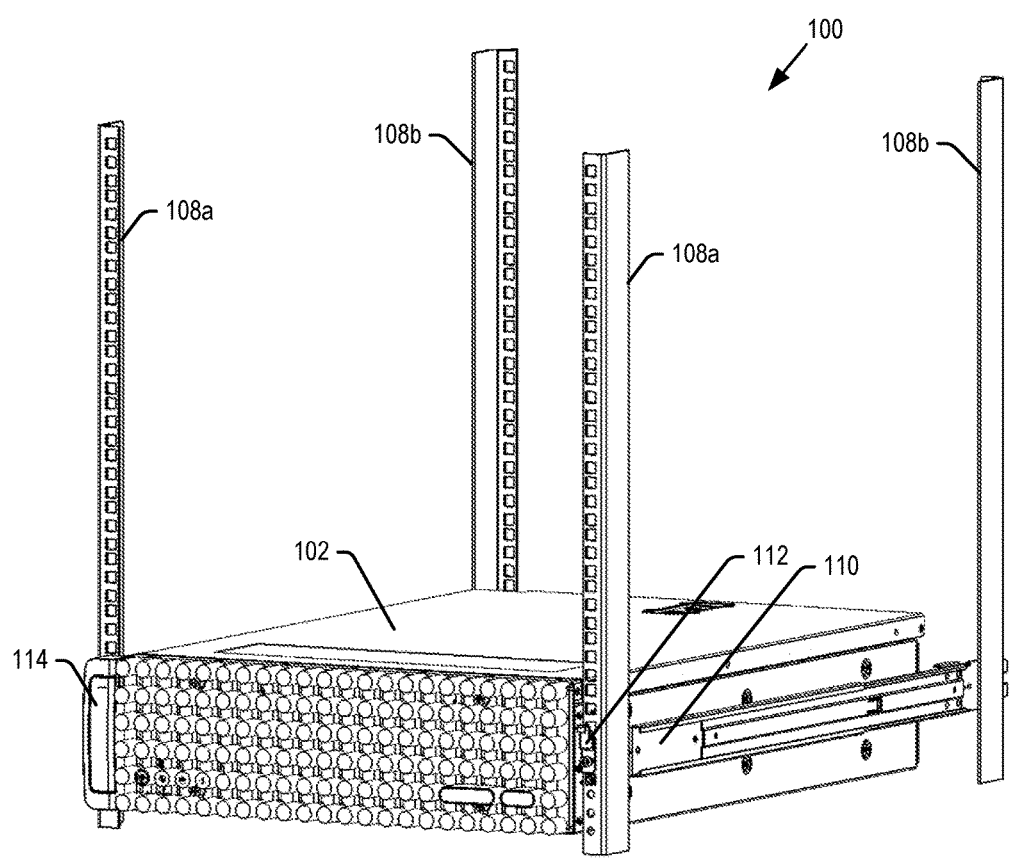
FIG. 2 is a partial perspective view showing the racks of a rack enclosure supporting a drive chassis.

FIG. 2 shows a portion of the rack enclosure 100 with the outer walls removed to expose four vertical racks 108 provided at the four corners of the rack enclosure. The racks 108 may comprise a pair of front racks 108a, and back racks 108b. Rail assemblies 110 are horizontally mounted, for example by screws, between opposed pairs of front and back racks 108, on each side of the rack enclosure 100. Although not critical to the present technology and not specifically shown, the rail assembly may include an internal rail which rides within an external track. The external track may be fixedly mounted to the front and back racks 108a, 108b. When a drive chassis 102 is inserted into the rack enclosure 100, the chassis 102 may be mounted to the internal rails of the rail assembly 110 on opposed sides of the rack enclosure so that the chassis may slide in and out of the rack enclosure on the rail assembly 110. While one rail assembly 110 is shown for a single chassis, the rack enclosure 100 may include a pair of rail assemblies 110 for each chassis 102 to be inserted into the enclosure 100.

Each chassis 102 is releasably secured within the rack enclosure 100 by a pair of locking assemblies 104, on opposed sides of the chassis 102. Each locking assembly 104 includes a catch 112 affixed to a front rack 108a, and a latch assembly 114 affixed to the chassis 102. The latch assembly 114 is omitted from view on one side of the chassis 102 in FIG. 2, so that the catch 112 is shown. Further details of the structure and operation of the catch 112 and latch assembly 114 of the locking assemblies 104 will now be described with reference to FIGS. 3-17. In the description that follows, a single catch 112 and a single latch assembly 114 are described. However, in embodiments, a pair of catches 112 and a pair of latch assemblies 114 are provided to secure each chassis 102 in rack enclosure 100, one on each side of the chassis 102. The catches 112 on opposed sides of a chassis are the mirror image of each other, and the latch assemblies 114 on opposed sides of a chassis are the mirror image of each other.

Figure 3:
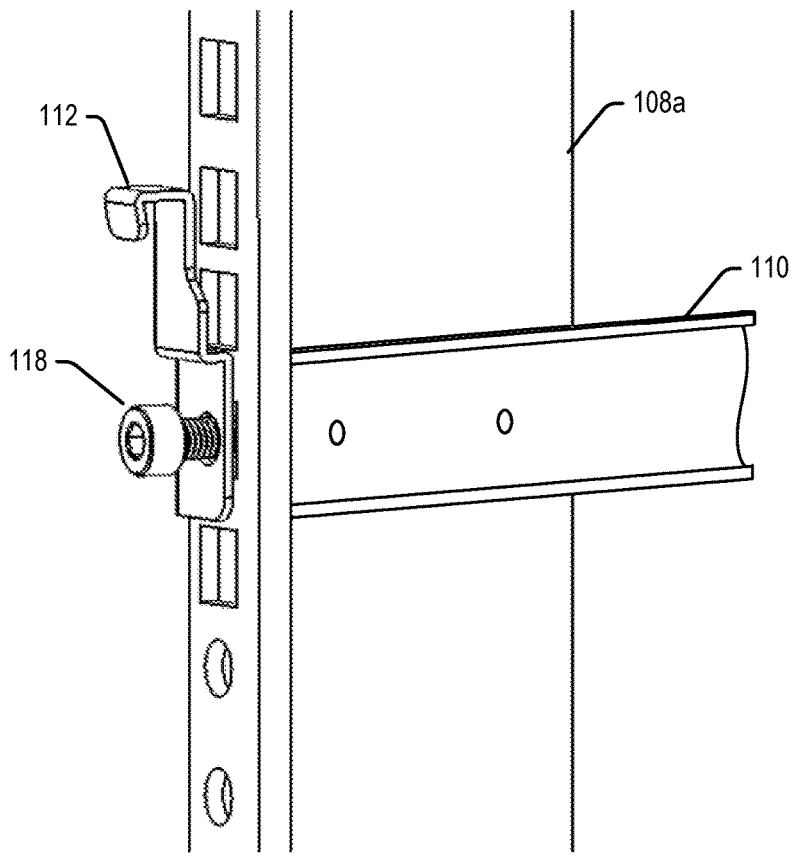
FIG. 3 is an enlarged view of a portion of a rack of a rack enclosure including a catch for locking a drive chassis in place.
Figure 4:
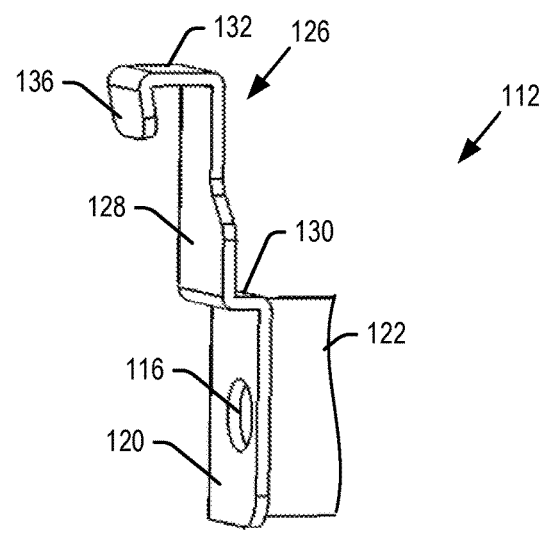

FIG. 3 shows an enlarged view of a section of one of the racks 108a including a catch 112. FIGS. 4-7 show enlarged perspective and side views of the catch 112. The catch 112 may be affixed to the rail assembly 110, and in particular to the external track of the rail assembly that is fixedly mounted to the racks 108a and 108b, via a connecting flange 122 partially shown in the drawings. The connecting flange 122 extends from a base plate 120 so that the base plate 120 may be positioned flush against or adjacent a front surface of rack 108a as shown in FIG. 3. The connecting flange 122 may extend from the base plate 120, around the rack 108a, and connect to the rail assembly 110. It is understood that the catch 112 may be directly affixed to the rack 108a, or connected to the rack enclosure 100, by other methods in further embodiments.

The catch 112 may include a hole 116. A fastening screw 118 may pass through the hole 116, through another hole in rack 108a, and fastens within a front flange 110a (FIG. 17) on the external track of the rail assembly 110. The fastening screw may be used to fix a chassis within the rack enclosure (for example during transport). The fastening screw 118 may also be used to affix the catch 112 to the rack 108a in further embodiments.

The catch 112 further includes a hooked clasp 126. The hooked clasp 126 includes first, second and third sections, each generally planar and angled with respect to each other. A first section is a vertical support section 128, which is vertically oriented (when the catch is affixed to the rail assembly 110) and offset from the base plate 120 by an offset 130. In embodiments, the offset maybe 3.5 mm to provide room for a screw affixing the rail assembly 110 to the rack 108a. It is understood that the offset may be greater or lesser than 3.5 mm in further embodiments. A second section is a horizontal spacer section 132, extending from the vertical support section 128 at a generally right angle. A third section is a downwardly extending prong 136, extending from the spacer section 132 at some angle which may be less than 90° as explained below.

The vertical support section 128 includes a relatively wide base to provide structural rigidity, which base tapers to a more narrow section adjacent the spacer section 132. The taper may be omitted in further embodiments. A flange 140 also extends at a generally right angle from the vertical support section 128 to impart further structural rigidity to the support section 128 and resistance to bending. The spacer section 132 extends from the vertical support section 128 to space the prong 136 away from the vertical support section 128. In one embodiment, the spacer section 132 may have a length (between the vertical support section 128 and prong 136) of 8.3 mm. It is understood that this distance may be greater or lesser in further embodiments.

The prong 136 extends downwardly from spacer section 132, and forms an angle, θ (FIG. 5), of for example 10° with vertical. The angle θ may be greater or lesser than 10° in further embodiments. The inclination of the prong 136 facilitates operation of the latch assembly 114 during insertion of a chassis into the rack enclosure as explained below. The prong 136 may have a length of approximately 5 mm, extending from the spacer section 132, though this distance may be greater or lesser in further embodiments.

In general, the three sections 128, 132 and 136 of the clasp 126 define a space 144 (FIG. 5) within which a hook portion of the latch assembly 114 is captured to lock the hook portion, latch assembly and chassis to the catch and rack enclosure. The three sections 128, 132 and 136 define an opening to the space 144 demarcated by a distance, d, which in embodiments may be 5 mm. This dimension, as well as other dimensions, of the clasp 126 may be varied. However, some dimensions may be varied together. For example, the angle θ of the prong 136 may be increased. However, in this instance, the length of spacer section 132 may also be proportionately increased, to ensure a large enough distance, d, to allow entry of the hook portion of the latch assembly into the space 144.

The catch 112 may formed of for example 1 mm to 1.2 mm thick sheet steel, though it may be formed of other thicknesses and of other materials in further embodiments, including for example other metals, such as aluminum, or a polymer. The shapes and bends of the catch 112 may be machined from a flat plate, though the catch 112 may be cast in further embodiments.

Figure 8:
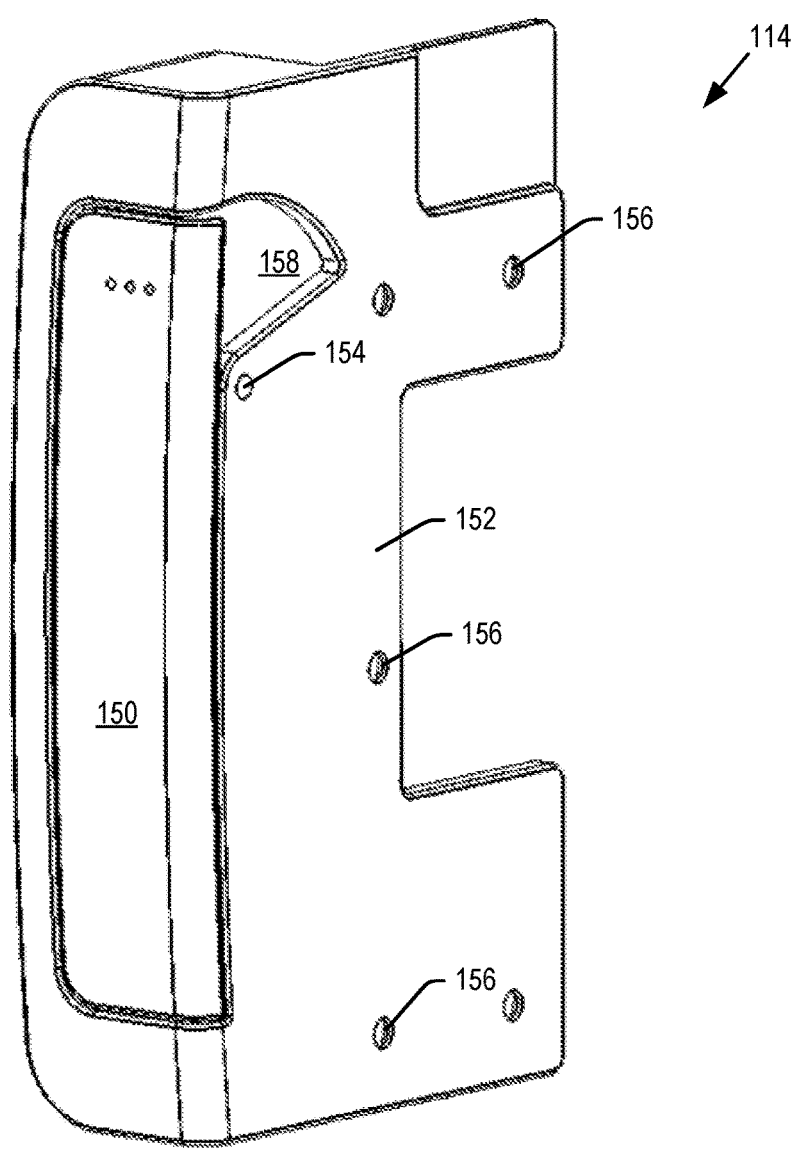
FIG. 8 is a perspective front view of a latch and latch housing of a latch assembly for locking a drive chassis in place according to embodiments of the present technology.

FIGS. 8-12 are various perspective and side views of the latch assembly 114. Referring initially to FIG. 8, the latch assembly 114 comprises a handle 150 pivotally mounted to a housing 152 via a pin 154. The housing 152 is in turn fixedly mounted to the chassis 102. The latch assembly 114 shown in FIG. 8 mounts to the left side of a chassis 102, for example by screws or bolts fitting through one or more of the holes 156 in the housing 152. As noted above, a mirror image latch assembly 114 may be affixed to the right side of the chassis 102.

When latch assembly 114 is in the locked position shown in FIG. 8, the handle 150 lies in a "home" position within a detent in the housing 152, so that an exterior surface of the handle 150 lies flush with an outer face of the housing 152. When the latch assembly 114 is in the open position, for example for removal from the rack enclosure 100, the handle 150 may rotate outward (as shown for example in FIG. 15). In this position, a top portion of the handle 150 rotates into a detent 158 formed in the housing 152 as shown in FIG. 8.

Figure 11:
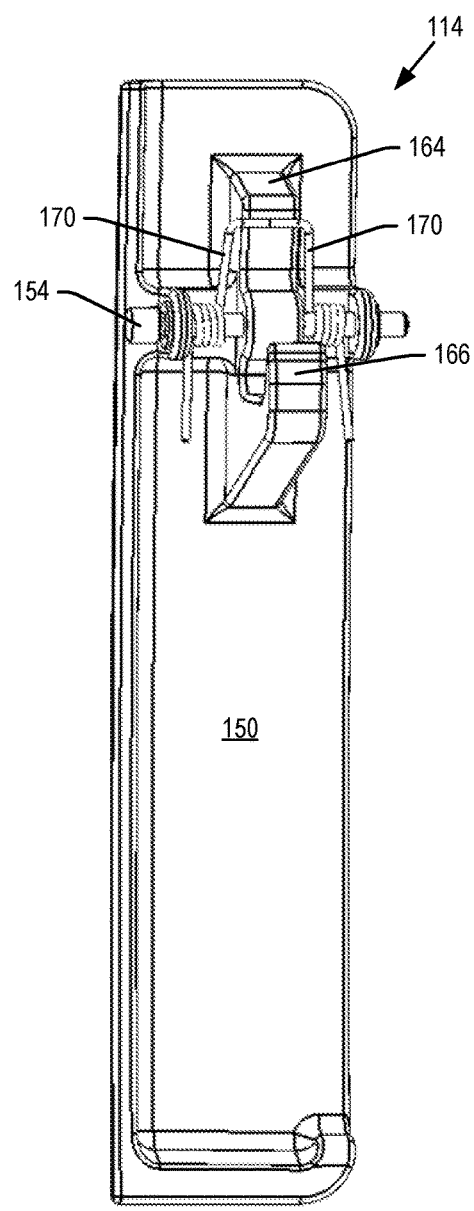
Figure 12:
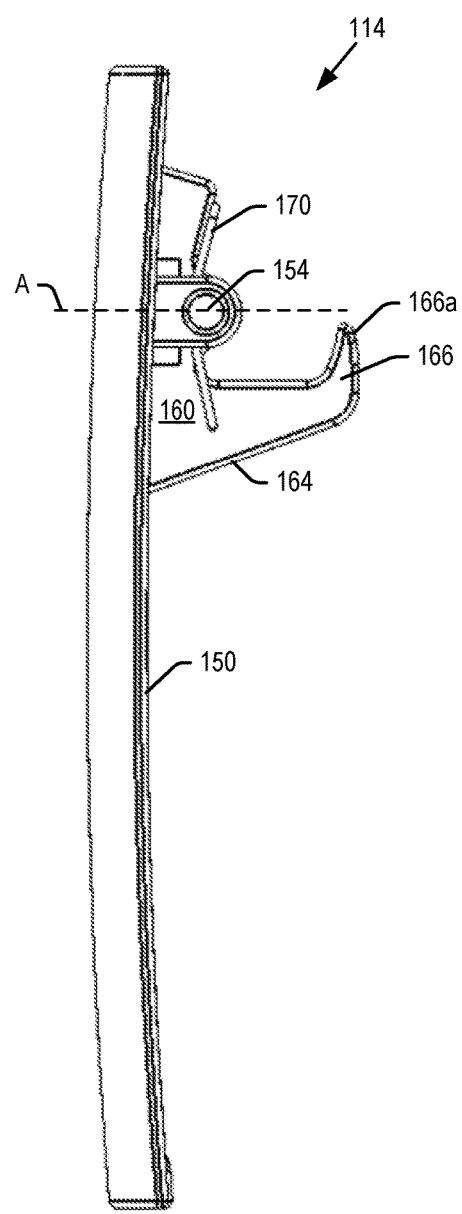

FIGS. 10-12 illustrate detail of a latch 160 of the latch assembly 114, on an interior surface of the handle 150. The latch 160 includes a latch body 164 and a hook portion 166 extending distally away from the handle 150. The pin 154 extends from both sides of the latch body 164 and into holes (not shown) formed in the housing 152 to pivotally attach the handle 150 and latch 160 to the housing 152. A pair of torsion springs 170 may be wrapped around the pin 154, one each on opposite sides of the latch 160. The pair of torsion springs 170 each include a first end braced against a top portion of the latch body 164, and a bottom portion braced against the housing 152 (the bottom portions of torsion springs 170 are shown, but the housing 152 is omitted from FIGS. 10-12). This mounting of the torsion springs 170 biases the handle 150 counterclockwise to the home position, and biases the hook portion 166 counterclockwise into an upright position, from the perspective shown for example in FIGS. 10-12.

The entirety of the hook portion 166 may be positioned at a lower elevation than the mounting pin 154, as indicated by line A in FIG. 12. In particular, line A runs through the mounting pin 154 and is oriented along the direction of insertion of the chassis 102 into the rack enclosure 100. As the hook portion 166 is lower than the mounting pin, a force against any surface of the hook portion 166 will be misaligned with line A, and will thus create a moment force biasing the latch 160 and handle 150 to rotate, clockwise in the example of FIG. 12. The hook portion 166 includes a distal face 166a, at an upper, distal portion of the hook portion 166, which is provided at an angle when the hook portion 166 is in the upright position. The angle of the distal face 166a may, for example, match that of the inclined prong 136. As explained below, when the inclined surfaces of the distal face 166a and prong 136 come together, the inclination of the surfaces also generates a moment force which further facilitates clockwise rotation.

The latch 160 may be cast metal, such as aluminum or steel, but it may be formed of other materials such as a polymer in further embodiments. The handle 144 may be formed of cast metal or a polymer.

Figure 13:
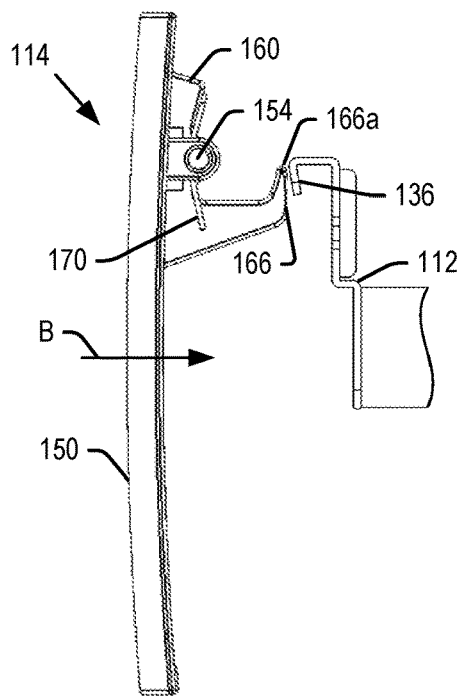
FIGS. 13-16 are side views at various stages of operation of the locking assembly according to embodiments of the present technology.

The self-actuating operation of the locking assembly 104 will now be described with respect to FIGS. 13-16 which show four stages in the insertion and locking of a chassis 102 within the rack enclosure 100 by the locking assembly 104. Initially, a chassis 102 is inserted horizontally in the direction of arrow B into a position within the rack enclosure 100 with the chassis supported and guided for insertion at its sides by the rail assembly 110 (FIG. 2). At some point before full insertion, the distal face 166a of the hook portion 166 will engage the inclined prong 136 of the catch 112, as shown in FIG. 13.

Figure 14:
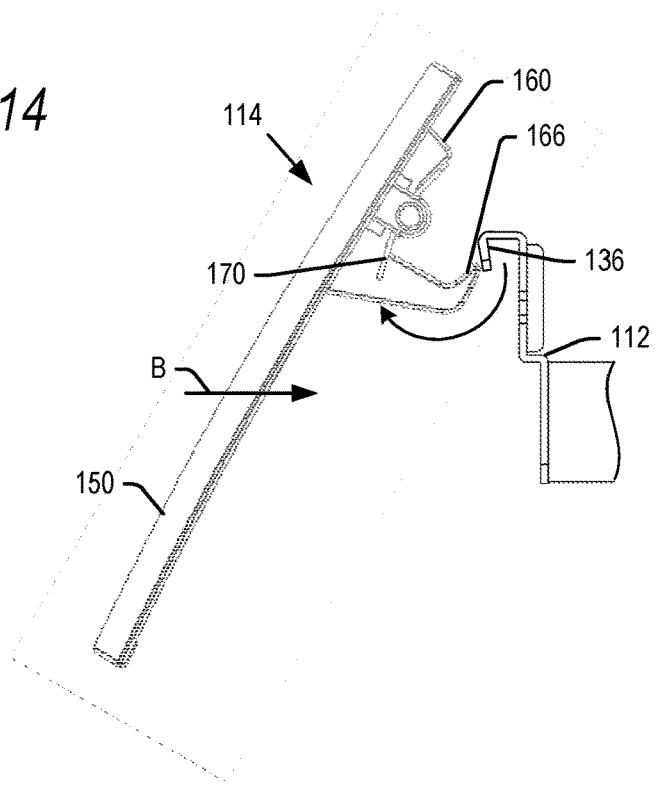

As noted above, the hook portion 166 of the latch assembly 114 is located below the elevation of the mounting pin 154. Thus, upon contact between the hook portion 166 and the inclined prong 136, a moment force is created within the latch assembly 114 biasing the latch assembly to rotate counterclockwise, against the moment force of the torsion spring 170. This counterclockwise moment force may be sufficient to rotate the latch assembly counterclockwise, as shown in FIG. 14.

However, in addition to this counterclockwise moment force, the prong 136 and at least the distal face 166a of hook portion 166 are inclined as shown and described above. Upon contact between the hook portion 166 and prong 136, the inclination of these surfaces creates a force component that is perpendicular to the direction in which the chassis is inserted. That is, when the respective inclined surfaces come together as the chassis 102 is pushed inward, the inclination of the surfaces creates a force component that is directed downward. This downward force component adds to the counterclockwise moment force. The combined counterclockwise moment force overcomes any frictional forces between the mating surfaces of the hook portion 166 and prong 136, to cause rotation of the latch assembly 114 clockwise, for example to a position shown in FIG. 14, upon continued insertion of the chassis in the direction of arrow B.

Figure 15:
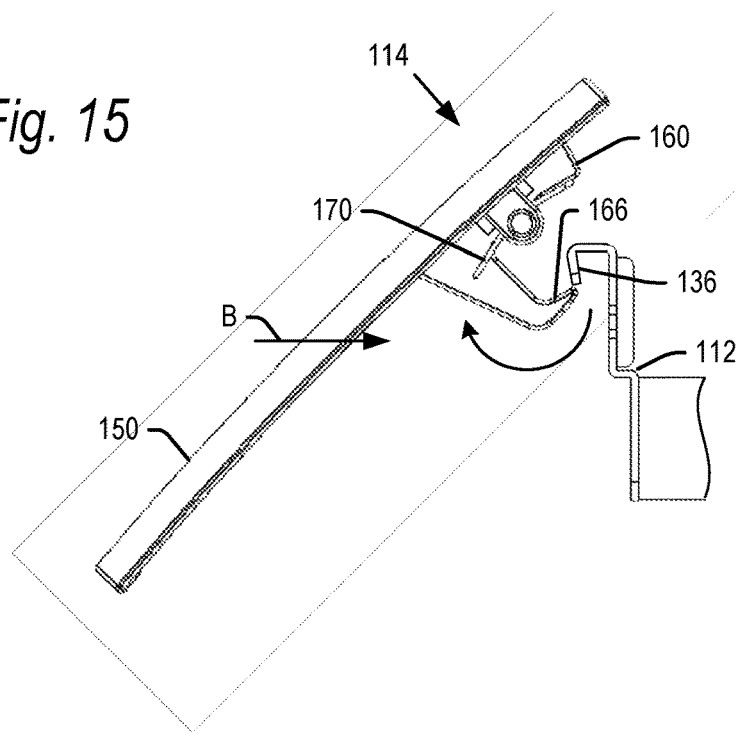
Figure 16:
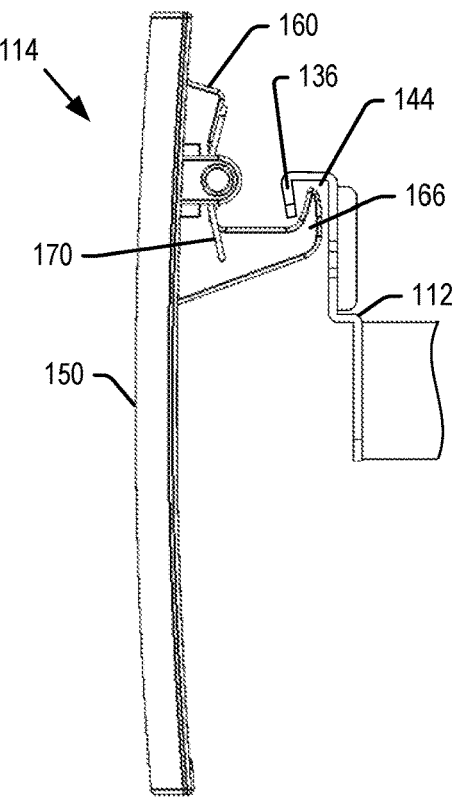

The counterclockwise rotation of the latch 160 causes the hook portion 166 to slide down the prong 136, and causes the handle 150 to rotate outward from its home position within the housing 152. At some point during continued insertion of the chassis 102 into the rack, and counterclockwise rotation of the latch assembly 114, the tip of the hook portion 166 will clear the end of the prong 136, as shown in FIG. 15. Upon further insertion of the chassis at that point, the hook portion will clear the prong 136. Once clear of the prong 136, the clockwise torsional force of the torsion spring 170, together with the force of gravity on the handle, will cause clockwise rotation of the handle back to its home position, and rotation of the latch 160 to its upright position, as shown in FIG. 16. In this position, the hook portion 166 is locked within the space 144. Thus, upon any attempt to withdraw the chassis 102, a proximal surface of the hook portion 166 (opposite the distal face 166a) will contact against an end of the prong 136, thereby preventing withdrawal of the chassis.

Where a chassis is inserted slowly, the hook portion 166 of the latch 160 will slide down the prong 136 until it clears the prong and moves into the space 144. However, it may happen that the chassis is inserted with sufficient force that, upon contact between the hook portion 166 and the prong 136, the latch assembly bounces back off of the prong 136. In this case, once the force of the torsion springs 170 rotates the latch assembly back, it may again contact the prong 136, and seat within the space 144 upon continued insertion. Alternatively, if the chassis is inserted at a certain speed, the latch assembly may bounce off of the prong 136, and once the force of the torsion springs 170 rotates the latch assembly back, the hook portion 166 may have already cleared the prong 136, and seat directly within the space 144 without contacting the prong again.

As noted, in embodiments, the above described operation of the latch assembly 114 and catch 112 takes place in the locking assemblies 104 on both sides of a chassis 102. However, it is conceivable that a chassis include a single locking assembly, on one side of the chassis, in further embodiments. The latch assembly 114 and catch 112 of such a locking assembly may operate as described above.

The latch assembly 114 in the above-described embodiments is self-actuating, in that the handle 150 and latch 160 automatically rotate open, and then automatically rotate closed to lock within the catch 112. Thus, a user need never manually open or even touch the handle 150 when locking a chassis 102 into the rack enclosure 100. This provides advantages with respect to the ease and speed with which chassis 102 may be inserted and locked within the rack enclosure 100. In order to remove a chassis from the rack enclosure, the handles 150 of both latch assemblies 114 for the chassis are rotated outward, for example by initially pushing on a top portion of the handles to rotate the top portion into the detent 158 (FIG. 8). The handles 150 are rotated until the hook portion 166 of the latch 160 clears out of the space 144. Thereafter, the chassis may be easily slid out of the rack enclosure by the handles. In addition to the quick and easy unlocking of the chassis according to the present technology, the handles further make removal of the chassis quick and easy.

The self-actuated locking of a chassis by the locking assemblies 104 is enabled by the particular configurations of the catch 112 and latch 160, and selection of dimensions of the catch 112 and latch 160, as described above. With the benefit of the above-description, it will be understood that some variation to the above-described configurations and/or dimensions is possible. However, the configurations and dimensions described above (with some variation) are significant in that without them, the above-described coordinated movement and self-actuated operation of the latch assembly 114 will not take place.

Figure 17:
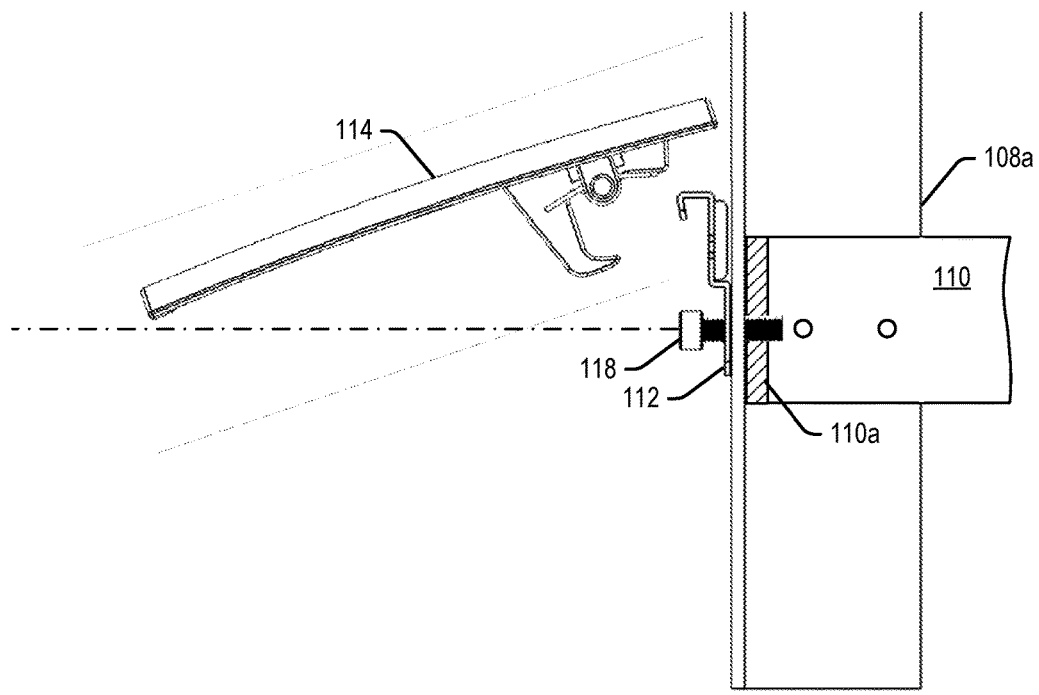
FIG. 17 is a side view showing clearance of handle of the latch assembly to allow insertion and removal of the chassis locking screw.

As noted above, a fastening screw 118 may be provided to fix a chassis to the rail assembly 110 and the rack enclosure 100. As shown in FIG. 17, the handle 150 of the latch assembly 114 is allowed sufficient rotation so that the fastening screw 118 on the rail assembly 110 may be accessed in a straight line by a tool such as a screwdriver to insert or remove the fastening screw 118.

In the above-described embodiments, the locking assembly includes both the catch 112 and latch assembly 114. However, in embodiments, the locking assembly may be comprised of solely the latch assembly 114. In such embodiments, the rack enclosure may include structure performing the above-described functions of the catch 112.

In summary, an example of the present technology relates to a locking assembly for removably locking a chassis within a rack enclosure, the rack enclosure including a first inclined surface, the locking assembly comprising: a latch assembly comprising a latch and a handle configured to be pivotally mounted with respect to the chassis, the handle rotationally mounted within the latch assembly for rotation between an open position and a home position, the latch configured to allow full insertion of the chassis into the rack enclosure when the handle is in the open position, and the latch configured to lock the chassis in the rack enclosure when the chassis is fully inserted into the rack enclosure and the handle is in the home position; the latch comprising a second inclined surface, the second inclined surface configured to contact the first inclined surface of the rack enclosure upon partial insertion of the chassis into the rack enclosure, wherein said contact between the first and second inclined surfaces rotates the handle from the home position to the open position to allow full insertion of the chassis into the rack enclosure.

In a further example, the present technology relates to a locking assembly for removably locking a chassis within a rack enclosure, the locking assembly comprising: a catch configured to be mounted within the rack enclosure, the catch comprising a first inclined surface; and a latch assembly comprising a latch and a handle configured to rotate about a mounting point, the handle rotating about the mounting point between an open position and a home position, the latch configured to allow insertion of the chassis into the rack enclosure and removal of the chassis from the rack enclosure when the handle is in the open position, and the latch configured to prevent insertion of the chassis into the rack enclosure and removal of the chassis from the rack enclosure when the handle is in the home position; the latch comprising a second inclined surface, the second inclined surface configured to contact the first inclined surface of the catch upon partial insertion of the chassis into the rack enclosure, at least one of an orientation of the second inclined surface with respect to the mounting point, and the contact between the first and second inclined surfaces, generating a force on the second inclined surface biasing the handle to rotate from the home position to the open position.

In another example, the present technology relates to a locking assembly for removably locking a chassis within a rack enclosure, the locking assembly comprising: a catch configured to be mounted at a surface of the rack enclosure, the catch comprising: a first section, a second section extending at an angle from the first section, and a third section extending at an angle from the second section, the third section inclined at an oblique angle with respect to the surface of the rack enclosure, the first, second and third sections defining a space; a latch assembly comprising a latch and a handle configured to be pivotally mounted with respect to the chassis at a mounting point, the handle rotationally mounted within the latch assembly for rotation between an open position and a home position, the latch being locked within the space when the chassis is fully inserted into the rack enclosure and the handle is in the home position, and the latch being free of the space when the handle is in the open position; the latch comprising an inclined surface configured to contact the third section of the catch upon partial insertion of the chassis into the rack enclosure, at least one of an orientation of the inclined surface with respect to the mounting point, and the contact between the inclined surface and third section, generating a force on the inclined surface biasing the handle to rotate from the home position to the open position.

In a still further example, the present technology relates to a locking assembly for removably locking a chassis within a rack enclosure, the locking assembly comprising: a catch configured to be mounted within the rack enclosure, the catch comprising a first biasing means and capture means; and a latch assembly comprising a latch means and a handle means configured to be pivotally mounted with respect to the chassis at a mounting point, the handle means rotationally mounted within the latch assembly for rotation between an open position and a home position, the latch means being locked within the capture means when the chassis is fully inserted into the rack enclosure and the handle means is in the home position, and the latch means being free of the capture means when the handle means is in the open position; the latch means comprising second biasing means, the second biasing means configured to contact the first biasing means of the catch upon partial insertion of the chassis into the rack enclosure, at least one of an orientation of the second biasing means with respect to the mounting point, and the contact between the first and second biasing means, generating a force on the second biasing means biasing the handle means to rotate from the home position to the open position.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A locking assembly for removably locking a chassis within a rack enclosure, the rack enclosure including a first inclined surface, the locking assembly comprising:
   a latch assembly comprising:
      a handle configured to be pivotally mounted with respect to the chassis, wherein the handle is rotationally mounted within the latch assembly for rotation between an open position and a home position; and
      a latch comprising a second inclined surface and configured to:
         allow full insertion of the chassis into the rack enclosure when the handle is in the open position, and
         lock the chassis in the rack enclosure when the chassis is fully inserted into the rack enclosure and the handle is in the home position;

wherein the second inclined surface is configured to contact the first inclined surface upon partial insertion of the chassis into the rack enclosure; and wherein said contact between the first and second inclined surfaces rotates the handle from the home position to the open position to allow full insertion of the chassis into the rack enclosure.

2. The locking assembly of claim 1, wherein:
a force between the first and second inclined surfaces has a force component directed perpendicularly to a direction of insertion of the chassis into the rack enclosure; and the force component forces the latch to slide along the first inclined surface.

3. The locking assembly of claim 1, wherein sliding of the latch along the first inclined surface rotates the handle to the open position.

4. The locking assembly of claim 1, a reference line being defined through a pivot point of the latch assembly oriented in a direction of insertion of the chassis into the rack enclosure, a force between the first and second inclined surfaces being misaligned with the reference line, the misalignment generating a moment force biasing the handle to rotate to the open position.

5. The locking assembly of claim 1, wherein the latch assembly further comprises at least one torsion spring biasing the handle to rotate from the open position to the home position.

6. The locking assembly of claim 1, wherein:
the second inclined surface of the latch is configured to move clear of the first inclined surface upon full insertion of the chassis into the rack enclosure; and clearance between the first and second inclined surfaces upon full insertion of the chassis into the rack enclosure rotates the handle from the open position to the home position to lock the chassis within the rack enclosure.

7. The locking assembly of claim 6, wherein the latch assembly further comprises at least one torsion spring configured to rotate the handle from the open position to the home position upon full insertion of the chassis into the rack enclosure and clearance between the first and second inclined surfaces.

8. A locking assembly for removably locking a chassis within a rack enclosure, the locking assembly comprising:
a catch configured to be mounted within the rack enclosure, the catch comprising a first inclined surface; and
a latch assembly comprising:
a handle configured to rotate about a mounting point between an open position and a home position; and
a latch comprising a second inclined surface and configured to:
allow insertion of the chassis into the rack enclosure and removal of the chassis from the rack enclosure when the handle is in the open position, and
prevent insertion of the chassis into the rack enclosure and removal of the chassis from the rack enclosure when the handle is in the home position;
wherein the second inclined surface is configured to contact the first inclined surface of the catch upon partial insertion of the chassis into the rack enclosure; and
wherein at least one of an orientation of the second inclined surface with respect to the mounting point, and the contact between the first and second inclined surfaces, is configured to generate a force on the second inclined surface biasing the handle to rotate from the home position to the open position.

9. The locking assembly of claim 8, wherein sliding of the second inclined surface along the first inclined surface rotates the handle from the home position to the open position.

10. The locking assembly of claim 8, wherein:
a force between the first and second inclined surfaces has a force component directed perpendicularly to a direction of insertion of the chassis into the rack enclosure; and the force component is configured to bias the handle to rotate from the home position to the open position.

11. The locking assembly of claim 8, wherein a force between the first and second inclined surfaces is configured to bias the second inclined surface to slide along the first inclined surface.

12. The locking assembly of claim 11, wherein sliding of the second inclined surface along the first inclined surface rotates the handle from the home position to the open position.

13. The locking assembly of claim 8, wherein:
the catch further comprises a space partially defined by the first inclined surface; and the space is configured to capture and hold a portion of the latch upon the chassis being fully inserted into the rack enclosure and the handle rotating to the home position.

14. The locking assembly of claim 8, wherein:
the catch further comprises a space partially defined by the first inclined surface;
the second inclined surface of the latch is configured to move clear of the first inclined surface upon full insertion of the chassis into the rack enclosure; and clearance between the first and second inclined surfaces upon full insertion of the chassis into the rack enclosure rotates the latch into the space in the catch.

15. The locking assembly of claim 14, wherein:
the latch assembly further comprises at least one torsion spring; and the torsion spring rotates the latch into the space in the catch upon clearance between the first and second inclined surfaces.

16. A locking assembly for removably locking a chassis within a rack enclosure, the locking assembly comprising:
a catch configured to be mounted at a surface of the rack enclosure, the catch comprising:
a first section,
a second section extending at an angle from the first section, and
a third section extending at an angle from the second section, the third section inclined at an oblique angle with respect to the surface of the rack enclosure, the first, second and third sections defining a space; and
a latch assembly comprising:
a handle configured to be pivotally mounted with respect to the chassis at a mounting point, wherein the handle is rotationally mounted within the latch assembly for rotation between an open position and a home position; and
a latch comprising an inclined surface and configured to:
lock within the space when the chassis is fully inserted into the rack enclosure and the handle is in the home position, and
be free of the space when the handle is in the open position;
wherein the inclined surface is configured to contact the third section of the catch upon partial insertion of the chassis into the rack enclosure; and wherein at least one of an orientation of the inclined surface with respect to the mounting point, and the contact between the inclined surface and third section, generates a force on the inclined surface biasing the handle to rotate from the home position to the open position.

17. The locking assembly of claim 16, wherein:
the inclined surface of the latch is configured to move clear of the third section upon full insertion of the chassis into the rack enclosure; and
clearance between the inclined surface and third section upon full insertion of the chassis into the rack enclosure rotates the latch into the space in the catch.

18. The locking assembly of claim 17, wherein:
the latch assembly further comprises at least one torsion spring; and
the torsion spring rotates the latch into the space in the catch upon clearance between the first and second inclined surfaces.

19. The locking assembly of claim 17, wherein manual rotation of the handle from the home position when the chassis is fully inserted into the rack enclosure frees the latch from the space and allows removal of the chassis from the rack enclosure.

20. A locking assembly for removably locking a chassis within a rack enclosure, the locking assembly comprising:
a catch configured to be mounted within the rack enclosure, the catch comprising a first biasing means and a capture means; and
a latch assembly comprising:
a handle means configured to be pivotally mounted with respect to the chassis at a mounting point, wherein the handle means is rotationally mounted within the latch assembly for rotation between an open position and a home position; and
a latch means comprising a second biasing means and configured to:
lock within the capture means when the chassis is fully inserted into the rack enclosure and the handle means is in the home position, and
be free of the capture means when the handle means is in the open position;
wherein the second biasing means is configured to contact the first biasing means of the catch upon partial insertion of the chassis into the rack enclosure; and
wherein at least one of an orientation of the second biasing means with respect to the mounting point, and the contact between the first and second biasing means, generates a force on the second biasing means biasing the handle means to rotate from the home position to the open position.

21. A locking assembly for removably locking a chassis within a rack enclosure, the rack enclosure including a first inclined surface, the locking assembly comprising:
a latch assembly comprising:
a handle configured to be pivotally mounted with respect to the chassis, wherein the handle is rotationally mounted within the latch assembly for rotation between an open position and a home position;
a latch comprising a second inclined surface and configured to:
allow full insertion of the chassis into the rack enclosure when the handle is in the open position, and
lock the chassis in the rack enclosure when the chassis is fully inserted into the rack enclosure and the handle is in the home position; and
at least one torsion spring configured to bias the handle to rotate from the open position to the home position;
wherein the second inclined surface is configured to contact the first inclined surface upon partial insertion of the chassis into the rack enclosure; and
wherein said contact between the first and second inclined surfaces rotates the handle from the home position to the open position to allow full insertion of the chassis into the rack enclosure.

22. The locking assembly of claim 21, wherein:
a force between the first and second inclined surfaces has a force component directed perpendicularly to a direction of insertion of the chassis into the rack enclosure; and
the force component forces the latch to slide along the first inclined surface.

23. The locking assembly of claim 21, wherein sliding of the latch along the first inclined surface rotates the handle to the open position.

24. The locking assembly of claim 21, a reference line being defined through a pivot point of the latch assembly oriented in a direction of insertion of the chassis into the rack enclosure, a force between the first and second inclined surfaces being misaligned with the reference line, the misalignment generating a moment force biasing the handle to rotate to the open position.

* * * * *